US 11,761,592 B2

(12) United States Patent
Park et al.

(10) Patent No.: US 11,761,592 B2
(45) Date of Patent: Sep. 19, 2023

(54) LIGHT EMITTING APPARATUS AND LIGHT RADIATOR INCLUDING THE SAME

(71) Applicant: SEOUL VIOSYS CO., LTD., Gyeonggi-do (KR)

(72) Inventors: Ki Yon Park, Gyeonggi-do (KR); Jun Yong Park, Gyeonggi-do (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 17/562,433

(22) Filed: Dec. 27, 2021

(65) Prior Publication Data

US 2022/0120388 A1    Apr. 21, 2022

Related U.S. Application Data

(63) Continuation of application No. 17/170,350, filed on Feb. 8, 2021, now Pat. No. 11,215,329, which is a
(Continued)

(30) Foreign Application Priority Data

Aug. 6, 2018    (KR) .................. 10-2018-0091142

(51) Int. Cl.
*F21K 9/69*        (2016.01)
*G02B 19/00*       (2006.01)
(Continued)

(52) U.S. Cl.
CPC ............ *F21K 9/69* (2016.08); *G02B 19/0066* (2013.01); *F21Y 2105/16* (2016.08); *F21Y 2115/10* (2016.08)

(58) Field of Classification Search
CPC ... F21K 9/69; G02B 19/0066; F21Y 2105/16; F21Y 2115/10
See application file for complete search history.

(56) References Cited

U.S. PATENT DOCUMENTS

2007/0139931 A1*    6/2007    Kim .................... H01L 33/58
                                                    257/E33.073
2011/0110102 A1    5/2011    Ku et al.
(Continued)

FOREIGN PATENT DOCUMENTS

CN    108321149 A    7/2018
CN    109920903 B    5/2020
(Continued)

OTHER PUBLICATIONS

Extended European Search Report issued in corresponding EP Application No. 19848198.8, dated Mar. 31, 2022, 9 pages.
(Continued)

*Primary Examiner* — Mary Ellen Bowman
(74) *Attorney, Agent, or Firm* — Perkins Coie LLP

(57) ABSTRACT

A light emitting apparatus includes a substrate, a plurality of light emitting structures, a window, and a reflector. The substrate has a luminous region and a non-luminous region. The plurality of light emitting structures is disposed on the luminous region of the substrate. The window has a dome shape and is disposed to cover the luminous region. The window is configured to control a traveling path of light emitted from the a plurality of light emitting structures. The reflector is configured to support the window and reflect the light emitted from the plurality of light emitting structures. The reflector has an opening that exposes the plurality of light emitting structures mounted on the substrate. A distance between two adjacent light emitting structures of the plurality of light emitting structures is 500 micrometers or less.

19 Claims, 11 Drawing Sheets

Related U.S. Application Data continuation of application No. PCT/KR2019/009763, filed on Aug. 6, 2019.

(51) Int. Cl.
*F21Y 105/16* (2016.01)
*F21Y 115/10* (2016.01)

(56) References Cited

U.S. PATENT DOCUMENTS

| | | | |
|---|---|---|---|
| 2014/0029238 A1 | 1/2014 | Ito et al. | |
| 2015/0054005 A1 | 2/2015 | Kim et al. | |
| 2016/0293813 A1* | 10/2016 | Aruga | H01L 33/58 |

FOREIGN PATENT DOCUMENTS

| | | | |
|---|---|---|---|
| JP | 2001-075508 A | 3/2001 | |
| JP | 2006073691 A | 3/2006 | |
| JP | 2007-142413 A | 6/2007 | |
| JP | 2007-173787 A | 7/2007 | |
| JP | 2017-011257 A | 1/2017 | |
| JP | 2017-059788 A | 3/2017 | |
| JP | 2017-220578 A | 12/2017 | |
| KR | 10-0649765 B1 | 11/2006 | |
| KR | 101638134 B1 | 7/2016 | |
| WO | 2013122337 A1 | 8/2013 | |
| WO | 2013176832 A1 | 11/2013 | |
| WO | 2016194404 A1 | 12/2016 | |
| WO | 2017164672 A1 | 9/2017 | |
| WO | 2018100775 A1 | 6/2018 | |

OTHER PUBLICATIONS

English translation of Office Action from corresponding Indian Patent Application No. 202137009284 dated Oct. 31, 2022 (9 pages).

English Translation of Office Action from corresponding Korean Patent Application No. 10-2018-0091142, dated Apr. 10, 2023 (7 pages).

English translation of Office Action from related Japanese Patent Application No. 2021-506474 dated Aug. 1, 2023, 2023 (8 pages).

* cited by examiner ved in UV curing devices.

LIGHT EMITTING APPARATUS AND LIGHT RADIATOR INCLUDING THE SAME

CROSS-REFERENCE OF RELATED APPLICATIONS AND PRIORITY

The Present Application is a continuation of U.S. patent application Ser. No. 17/170,350 filed Feb. 8, 2021 which is a continuation of International Application No. PCT/KR/2019/009763 filed Aug. 6, 2019 which claims priority to Korean Application No. 10-2018-0091142 filed Aug. 6, 2018, the disclosures of which are incorporated by reference in their entirety as if they are fully set forth herein.

TECHNICAL FIELD

Embodiments of the present disclosure relate to a light emitting apparatus and a light radiator including the same.

BACKGROUND

A light emitting diode refers to a semiconductor device that emits light through recombination of electrons and holes. The light emitting diode emits light in various wavelength bands, such as visible light and UV light, and may be used as a UV curing machine, a sterilizer, a light source, and the like. In particular, UV light emitting diodes are widely used in UV curing devices.

SUMMARY

Embodiments of the present disclosure provide a light emitting apparatus emitting uniform light and a light radiator including the same.

According to one or more embodiments of the present disclosure, a light emitting device includes a substrate having a luminous region and a non-luminous region, a plurality of light emitting structures disposed on the luminous region of the substrate, a window, a reflector, and an adhesive layer. The window has a dome shape and is disposed to cover the luminous region. The window is configured to control a traveling path of light emitted from the a plurality of light emitting structures. The reflector is configured to support the window and reflect the light emitted from the plurality of light emitting structures. The reflector has an opening that exposes the plurality of light emitting structures mounted on the substrate. The adhesive layer is disposed between the window and the reflector. The window includes a base and a lens formed above one of surfaces of the base and an end portion of the base protrudes from a side surface of the lens. The window is configured to have a convex shape in the light traveling direction. A distance between two adjacent light emitting structures of the plurality of light emitting structures is 500 micrometers or less.

In at least one variant, the non-luminous region is provided with conductive patterns electrically connected to the plurality of light emitting structures.

In another variant, the plurality of light emitting structures emit light, via the dome shape of the window, at a beam angle of 90 degrees of more.

In another variant, in a light profile of light emitted from the light emitting device, a difference between a valley value and a peak value is 10% or less.

In another variant, the opening defines the luminous region and the lens has a bottom shape corresponding a shape of the opening.

In another variant, a height of the window is 70% or less of a lower diameter thereof.

In another variant, the distance between the two adjacent light emitting structures of the plurality of light emitting structures is 200 micrometers.

In another variant, the luminous region includes a first pad disposed between the substrate and each of the light emitting structures, and a second pad disposed around the luminous region, wherein the plurality of light emitting diodes are connected to the second pad by electrical bonding.

In another variant, the light emitting structures emit UV light.

According to one or more embodiments of the present disclosure, a light emitting device includes a substrate having a first region and a second region, a plurality of light emitting structures disposed on the first region of the substrate, a window, and a reflector. The window has a dome shape and is disposed to cover the first region. The window is configured to control a traveling path of light emitted from the plurality of light emitting structures. The reflector is configured to support the window and reflect the light emitted from the plurality of light emitting structures. The reflector has an opening that exposes the plurality of light emitting structures mounted on the substrate. The window includes a base and a lens formed on one surface of surfaces of the base. The window is configured to have a convex shape in the light traveling direction. An end portion of the base protrudes from a side surface of the lens. In a profile of light emitted from the light emitting device, a difference between a valley value and a peak value is 10% or less.

In at least one variant, a distance between two adjacent light emitting structures is 500 micrometers or less.

In another variant, the second region is provided with conductive patterns electrically connected to the light emitting structures.

In another variant, the plurality of light emitting structures emit light, via the dome shape of the window, at a beam angle of 90 degrees of more.

In another variant, the opening defines the first region and the lens portion has a bottom shape corresponding a shape of the opening.

According to one or more embodiments of the present disclosure, a light emitting device includes a substrate having a luminous region and a non-luminous region, a light emitting unit disposed on the luminous region of the substrate, a window disposed to cover the luminous region, the window configured to control a traveling path of light emitted from the light emitting unit, a reflector configured to support the window and reflect the light emitted from the light emitting unit, and an adhesive layer. The reflector has an opening that exposes the light emitting unit mounted on the substrate. The adhesive layer is disposed between the substrate and the reflector. The window includes a base and a lens formed on one surface of surfaces of the base and is configured to have a convex shape in the light traveling direction. A height of the lens is 70% or less of a lower diameter thereof. In a light profile of light emitted from the light emitting device, a difference between a valley value and a peak value is 10% or less.

In at least one variant, the non-luminous region is provided with conductive patterns electrically connected to the light emitting unit.

In another variant, the light emitting device further includes a phosphor portion disposed in the window.

In another variant, the reflector has a stepped portion on a top surface thereof.

In another variant, the lens has a larger area than a size of the opening.

In another variant, an inner wall of the opening has an inclined portion.

In accordance with one embodiment of the present disclosure, a light emitting apparatus including a substrate, a plurality of light emitting diodes arranged in a matrix on the substrate, and a window disposed in a dome shape on the light emitting diodes and controlling a traveling path of light emitted from the light emitting diodes. A height of the window is 70% or less of a lower diameter thereof such that the light emitted from the light emitting diodes is condensed at a beam angle of 90 degrees or less.

In at least one variant, the window may include a base and a lens portion protruding from one surface of the base and having a circular shape in plan view, and the lens portion may have different gradient variations depending upon an angle from an upper surface of the base with reference to the center of the circular shape on a cross-section of the lens portion perpendicular to the upper surface of the base and taken across the center of the circular shape on the base.

In another variant, assuming that the lens portion sequentially has first to $m^{th}$ regions (m being an integer of 3 or more) according to an angle from the upper surface of the base with reference to the center of the circular shape, a gradient variation in an $n^{th}$ region ($1<n<m$) may be greater than a gradient variation in an $(n-1)^{th}$ region and a gradient variation in an $(n+1)^{th}$ region.

In yet another variant, on a cross-section of the lens portion taken across the center thereof, a curve constituting the lens portion may have a radius of curvature gradually decreasing and then increasing in a direction from the upper surface of the base towards a vertex of the lens portion.

In further another variant, assuming that radii of curvature at three points sequentially disposed on a cross-section of the lens portion taken across the center thereof are referred to as first to third radii of curvature, respectively, the second radius of curvature may be less than the first and third radii of curvature.

In further another variant, the light emitting diodes may be disposed on a surface of the substrate corresponding to a region between points having the smallest radius of curvature at opposite sides on a cross-section of the lens portion taken across the center thereof.

In another variant, the light emitting diodes may emit light at a beam angle of 90 degrees or more.

In another variant, a distance between two adjacent light emitting diodes may be 500 micrometers or less.

In another variant, each of the light emitting diodes may be independently driven and may be a vertical type.

In another variant, in a profile of light emitted from the light emitting apparatus, a difference between a valley value and a peak value may be 10% or less.

In another variant, the light emitting apparatus may further include: a first pad disposed between the substrate and each of the light emitting diodes and a second pad disposed around the luminous region, wherein the light emitting diodes may be connected to the second pad by wire bonding.

In another variant, the light emitting diodes may emit UV light.

In some forms, the light emitting apparatus according to the embodiments of the present disclosure may be employed by a light radiator. The light radiator may include a plurality of light emitting apparatuses, wherein each of the light emitting apparatuses may include a substrate, a plurality of light emitting diodes arranged in a matrix on the substrate, and a window disposed in a dome shape on the light emitting diodes and controlling a traveling path of light emitted from the light emitting diodes. A height of the window is 70% or less of a lower diameter thereof such that the light emitted from the light emitting diodes is condensed at a beam angle of 90 degrees or less thereby.

Embodiments of the present disclosure provide a light emitting apparatus having high reliability. Embodiments of the present disclosure provide a light radiator employing the light emitting apparatus to emit uniform light.

DETAILED DESCRIPTION OF EMBODIMENTS

Figure 1:
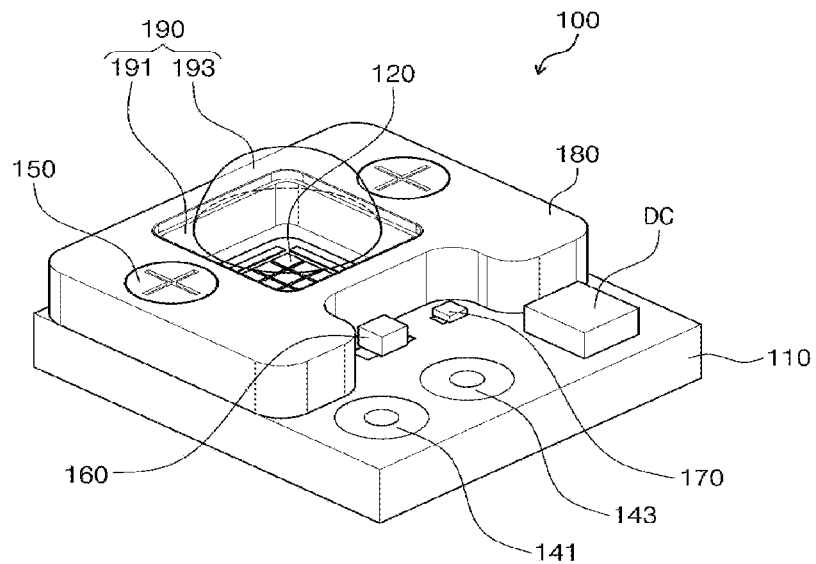
FIG. 1 is a perspective view of a light emitting apparatus according to one embodiment of the present disclosure.

It should be understood that various modifications, variations, and alterations can be made by those skilled in the art without departing from the spirit and scope of the present disclosure and specific embodiments will be illustrated in the drawings and described in detail. However, it should be understood that these embodiments are given by way of example only and are not intended to limit the present disclosure. Therefore, the scope of the present disclosure should be defined by the appended claims and equivalents thereto.

Hereinafter, exemplary embodiments of the present disclosure will be described in detail.

Figure 2:
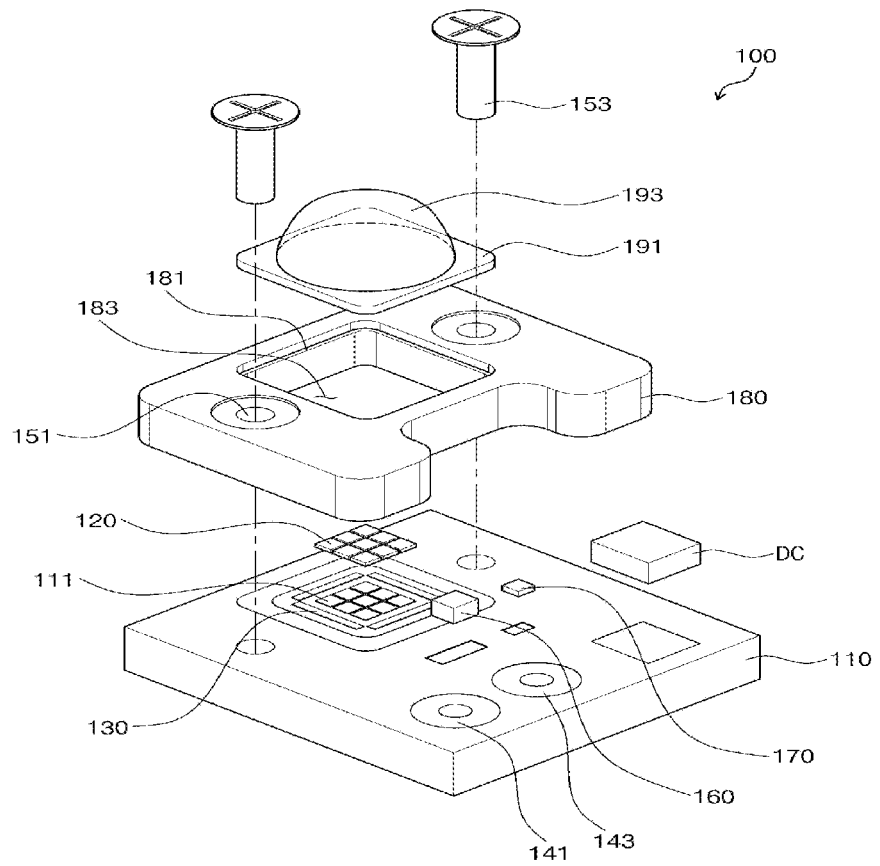
FIG. 2 is an exploded perspective view of the light emitting apparatus shown in FIG. 1.
Figure 3:
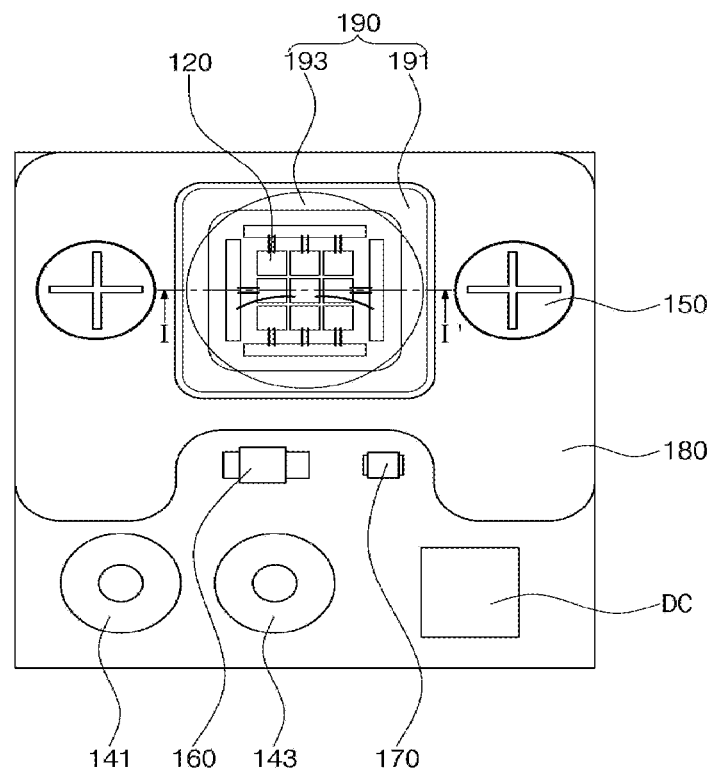
FIG. 3 is a plan view of the light emitting apparatus shown in FIG. 1.
Figure 4:
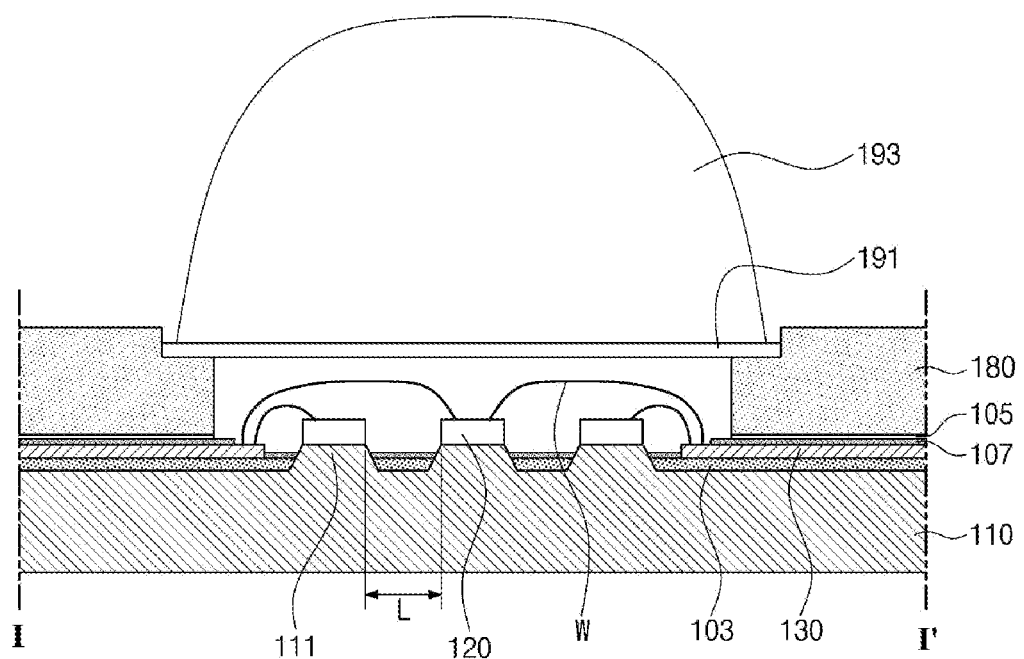
FIG. 4 is a cross-sectional view taken along line I-I' of FIG. 3.

FIG. 1 is a perspective view of a light emitting apparatus according to one embodiment and FIG. 2 is an exploded perspective view of the light emitting apparatus shown in FIG. 1. FIG. 3 is a plan view of the light emitting apparatus shown in FIG. 1 and FIG. 4 is a cross-sectional view taken along line I-I' of FIG. 3.

Referring to FIG. 1 to FIG. 4, the light emitting apparatus according to the embodiment of the present disclosure includes a substrate 110 defining an overall shape of the light emitting apparatus, a plurality of light emitting diodes 120 disposed on the substrate 110 and emitting light, and a window 190 disposed on the light emitting diodes 120 to control a traveling path of the light emitted from the light emitting diodes 120.

A pad portion is provided to the light emitting diodes 120 and electrically connected thereto. The pad portion may be connected to a terminal unit for electrical connection to external elements. The light emitting apparatus may be further provided with additional elements including the window allowing transmission of light emitted from the light emitting diodes 120 therethrough, an antistatic element 160, and the like.

The substrate 110 is configured to have at least one light emitting diode 120 mounted thereon.

The substrate 110 may be provided with the at least one light emitting diode 120 and interconnects, for example, the pad portion, the terminal unit and/or connectors, to connect the at least one light emitting diode 120 to an external power source, external wires, and the like.

The substrate 110 may have various shapes. By way of example, the substrate 110 has a substantially square shape in plan view and may be realized by a plate having a certain height. Alternatively, the substrate 110 may be provided in a rectangular shape in plan view and may have a pair of long sides and a pair of short sides. However, it should be understood that the shape or size of the substrate 110 is not limited thereto.

At least part of the substrate 110 may be formed of a conductive material. The substrate 110 may be formed of, for example, a metal, which may include copper, iron, nickel, chromium, aluminum, silver, gold, titanium, and alloys thereof. However, it should be understood that the substrate 110 is not limited thereto and may be formed of a non-conductive material. For the substrate 110 formed of the non-conductive material, a conductor may be disposed on an upper surface of the substrate 110. The non-conductive material may include a ceramic material, a resin, glass, or a composite thereof (for example, a composite resin or a mixture of a composite resin and a conductive material).

An insulating layer may be further disposed on the substrate 110 and first and second pads 111, 130 described below may be provided on the insulating layer.

The substrate 110 has a luminous region in which the light emitting diodes 120 are disposed to emit light and a non-luminous region excluding the luminous region. The luminous region and the non-luminous region may be determined according to the presence and arrangement of the light emitting diodes 120, and the non-luminous region is provided with conductive patterns (for example, the pad portion, the terminal unit, and the like) electrically connected to the light emitting diodes 120 and with various elements (for example, the antistatic element 160, a temperature measurement device 170, and the like).

The luminous region is provided with the plurality of light emitting diodes 120, which will be described below.

The substrate 110 may have a monolithic structure, without being limited thereto. Alternatively, the substrate 110 may be realized by a combination of two sub-substrates 110.

The substrate 110 may be provided with a reflector 180 having a stepped portion 181 on which the window 190 is mounted. The window 190 may be mounted on the stepped portion 181 of the reflector 180. The stepped portion 181 may have a depth substantially the same as a thickness of a base 191 of the window 190, whereby an upper surface of the base 191 may be coplanar with an upper surface of the reflector 180 excluding the stepped portion 181. Alternatively, the stepped portion 181 may have a greater thickness than the window 190.

The window 190 may be disposed in the luminous region of the substrate 110. That is, the window 190 is disposed in a region in which the light emitting diodes 120 are arranged and through which light emitted from the light emitting diodes 120 travels. That is, the window 190 may have an area corresponding to the luminous region or a larger area than the luminous region. With this structure, the window 190 may cover the entirety of the luminous region.

In this embodiment, the window 190 may have a lens shape that condenses light. The window 190 may include a plate-shaped base 191 and a lens portion 193 protruding upwards from the base 191, as shown in FIGS. 1 and 2.

In some forms, the window 190 is formed of a transparent insulating material to transmit light emitted from the light emitting diodes 120 and protects the light emitting diodes 120 while transmitting the light emitted from the light emitting diodes 120. Further, the window 190 acts as an optical lens and changes a traveling path of light so as to have a predetermined beam angle upon transmission of light therethrough. For example, the lens portion 193 condenses light emitted from the light emitting diodes 120 so as to emit light at a beam angle of 90 degrees or less. According to the embodiment, even when the light emitting diodes 120 emit light at a beam angle of 90 degrees or more, the window 190 condenses the light emitted from the light emitting diodes 120 so as to emit light at a beam angle of 90 degrees or less. As a result, the emitted light has a relatively uniform profile.

The window 190 may be formed of a material that is not deformed or discolored by light emitted from the light emitting diodes 120. For example, when the light emitted from the light emitting diodes 120 is UV light, the window 190 may be formed of a material that is not deformed or discolored by UV light. The window 190 may be formed of various materials so long as the window can have the functions described above without being limited to a particular material. For example, the window 190 may be formed of quartz or a polymer organic material. Here, since polymer glass materials have different absorption/transmission wavelengths depending on the type of monomer, a molding method and molding conditions, the polymer glass material may be selected in consideration of the wavelength of light emitted from the light emitting diodes 120. For example, organic polymers, such as poly(methyl methacrylate) (PMMA), polyvinyl alcohol (PVA), polypropylene (PP), and low-density polyethylene (PE), hardly absorb UV light, whereas organic polymers such as polyesters can absorb UV light.

In one embodiment, the base 191 (FIG. 2) may have a substantially square shape and the lens portion 193 may have a circular shape in plan view. However, these shapes are provided by way of example and the base 191 may have a different shape in plan view and, for example, may have the same shape as the lens portion 193. In particular, the shape of the base 191 may be changed according to the shape of an opening 183 of the reflector 180, which will be described below. When the opening 183 has a circular shape, the base 191 may also have a circular shape similar to the lens portion 193.

The shape of the window 190 will be further described below.

The reflector 180 supports the window 190 while reflecting the light emitted from the light emitting diodes 120. In particular, a sidewall of the reflector 180 facing the light emitting diodes 120 reflects the light emitted from the light emitting diodes 120.

The reflector 180 is coupled to an upper portion of the substrate 110. The reflector 180 may be formed with the opening 183 that exposes the light emitting diodes 120 mounted on the substrate 110. The opening 183 may have a rectangular shape in plan view, but it is not limited thereto. Alternatively, the opening 183 may have a circular shape or other polygonal shapes. Such a shape may be modified in various ways depending upon a mounting structure of the light emitting diodes 120 or a desired shape of light emitted from the light emitting apparatus.

The window 190 may be mounted on a portion of the reflector 180 in which the opening 183 is formed. To this end, a stepped portion, for example, a mounting groove, may be formed on an inner surface of the opening 183.

Further, the reflector 180 may be provided with a fastening portion 150 for fastening with the substrate 110, as shown in FIGS. 1 and 3. The fastening portion 150 may be realized in various forms, for example, in the form of at least one fastening hole 151, which is formed through upper and lower surfaces of the reflector, and a screw 153 inserted into the fastening hole 151, as shown in FIG. 2. The fastening hole 151 may be provided to each of opposite sides of the reflector 180. Although not shown, the substrate 110 may be provided with substrate holes corresponding to the fastening holes 151, in which the substrate holes may have substantially the same diameter as that of the fastening holes. The reflector 180 may be fastened to the substrate 110 using fastening members, such as screws 153, with the fastening holes 151 and the substrate holes disposed at the same locations.

In this embodiment, the reflector 180 serves to guide light emitted from the light emitting diodes 120 disposed inside the opening 183 to be discharged through an upper portion thereof while protecting the light emitting diodes 120 disposed inside the opening 183.

Further, the reflector 180 may include a metal such that heat generated from the light emitting diodes 120 can be transferred to the reflector 180 through the substrate 110 so as to be dissipated through the reflector 180.

A coating may be formed on an outer surface of the reflector 180 by an anodizing method, whereby the outer surface of the reflector 180 may be black.

The window 190 is inserted into the stepped portion 181 formed on the reflector 180 to be coupled to the reflector 180. Accordingly, the window 190 may have a larger area than the opening. In addition, the window 190 may be formed of a material, such as glass and the like, and may have one or more types of phosphors dispersed therein.

The reflector 180 may be bonded to the substrate 110 via a bonding layer 107 interposed therebetween, as shown in FIG. 4. The bonding layer 107 may be formed of any material capable of bonding the reflector 180 to the substrate 110 without being limited to a particular material.

The bonding layer 107 may be formed of an organic polymer-containing organic adhesive or a metal-containing solder. When the bonding layer 107 is formed of the organic adhesive, the bonding layer 107 may be interposed between the reflector 180 and the substrate 110 to bond the reflector 180 to the substrate 110. When the bonding layer 107 is formed of the metal-containing solder, the bonding layer 107 may be subjected to surface treatment such that opposite surfaces of the reflector 180 and the substrate 110 facing each other can be soldered. For example, a separate soldering pad may be further formed through surface treatment to facilitate soldering in a region of the substrate 110 on which the reflector 180 will be disposed.

In this embodiment, the reflector 180 serves to guide light emitted from the light emitting diodes 120 disposed inside the opening 181 to be discharged through the upper portion thereof while protecting the light emitting diodes 120 disposed inside the opening 181. Further, the reflector 180 may include a metal such that heat generated from the light emitting diodes 120 can be transferred to the reflector 180 through the substrate 110 so as to be dissipated through the reflector 180.

In this embodiment, although an inner wall of the reflector 180 defining the opening 183 corresponding to the luminous region is illustrated as being perpendicular to an upper surface of the substrate 110, it should be understood that other implementations are possible and the reflector may have other shapes so as to improve luminous efficacy. For example, the inner wall of the reflector 180 defining the opening may be slanted with respect to the upper surface of the substrate 110.

The reflector 180 may be formed with a protective groove recessed from one side thereof towards the opening 183. That is, the protective groove may be formed between opposite protruding ends of an outer side surface of the reflector 180. When the reflector 180 is disposed on the substrate 110, the elements (for example, the antistatic element 160, the temperature measurement device 170, and the like) mounted on the substrate 110 are disposed in the protective groove of the reflector 180 such that the reflector 180 surrounds at least part of the elements to protect the surrounded elements from the outside.

In some forms, the light emitting diodes 120 are provided in plural and are disposed in the luminous region of the substrate 110.

In the embodiment, the light emitting diodes 120 are arranged in a matrix. The matrix may have any shape as long as the light emitting diodes are arranged in rows and columns as a whole, and the rows and the columns are necessarily be provided in the form of straight columns.

In some forms, the light emitting diodes 120 disposed between two adjacent rows and between two adjacent columns are separated by a predetermined distance or less from each other. For example, a distance L between two adjacent light emitting diodes 120 may be 500 micrometers or less. If the distance L between two adjacent light emitting diodes 120 exceeds 500 micrometers, non-uniform illumination occurs due to difference in luminous quantity between a region above the light emitting diodes 120 and a region above a gap between the light emitting diodes 120. In this case, it is difficult to overcome non-uniformity even when the window 190 condenses the light emitted from the light emitting diodes.

In one embodiment, the light emitting diodes 120 may be connected to one power source so as to be operated at the same time or may be connected to different power sources so as to be independently operated.

Figure 5:
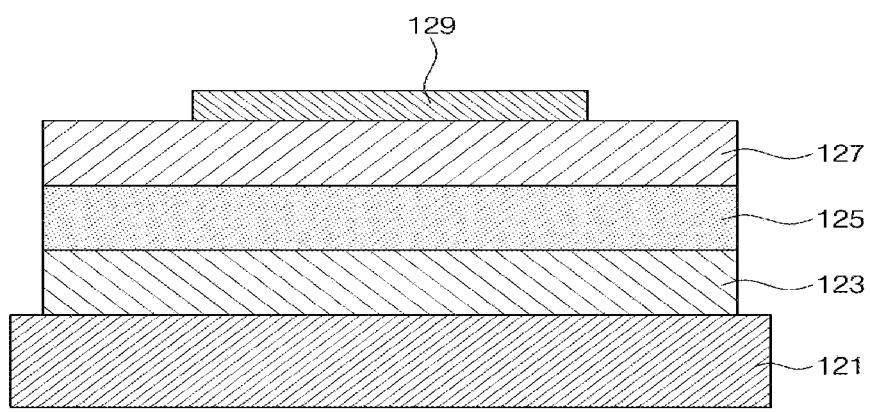
FIG. 5 is a sectional view of a light emitting diode according to one embodiment of the present disclosure.

In one embodiment, the light emitting diodes 120 may be vertical type light emitting diodes. FIG. 5 is a sectional view of the light emitting diode 120 according to one embodiment of the present disclosure.

Referring to FIG. 5, the light emitting diode 120 includes a light emitting structure, which includes a first semiconductor layer 123, an active layer 125, and a second semiconductor layer 127, and an anode 121 and a cathode 129 connected to the light emitting structure.

The first semiconductor layer 123 is doped with a first conductivity type dopant. The first conductivity type dopant may be a p-type dopant. For instance, the first conductivity type dopant may include Mg, Zn, Ca, Sr, Ba, and the like.

In other forms, the first semiconductor layer 123 may include a nitride semiconductor material. For example, the first semiconductor layer 123 may be formed of a semiconductor material having a composition represented by $In_xAl_yGa_{1-x-y}N$ ($0 \leq x \leq 1$, $0 \leq y \leq 1$, $0 \leq x+y \leq 1$). In some embodiments, the semiconductor material having this composition may include GaN, AlN, AlGaN, InGaN, InN, InAlGaN, AlInN, and the like. The first semiconductor layer 123 may be formed by growing the semiconductor material so as to contain the p-type dopant, such as Mg, Zn, Ca, Sr, Ba, and the like.

The active layer 125 is formed on the first semiconductor layer 123 and acts as a light emitting layer. The active layer 125 is a layer in which electrons (holes) injected through the first semiconductor layer 123 recombine with holes (electrons) injected through the second semiconductor layer 127 to emit light based on a band gap between energy bands of materials forming the active layer 125. The active layer 125 may emit light such as UV light, visible light, and IR light.

The active layer 125 may be realized by a compound semiconductor. By way of example, the active layer 125 may be realized by at least one selected from among Group III-V or II-VI compound semiconductors. The active layer 125 may employ a quantum well structure. In some forms, the active layer 125 may have a multi-quantum well structure in which quantum well layers and barrier layers are alternately stacked one above another. However, the active layer 125 is not limited thereto and may have a quantum wire structure, a quantum dot structure, or the like.

The second semiconductor layer 127 is formed on the active layer 125. The second semiconductor layer 127 is a semiconductor layer doped with a second conductivity type dopant having an opposite polarity to the first conductivity type dopant. The second conductivity type dopant may be an n-type dopant and may include, for example, Si, Ge, Se, Te, O, C, and the like.

In one embodiment, the second semiconductor layer 127 may include a nitride semiconductor material. For example, the second semiconductor layer 127 may be formed of a semiconductor material having a composition represented by $In_xAl_yGa_{1-x-y}N$ ($0 \leq x \leq 1$, $0 \leq y \leq 1$, $0 \leq x+y \leq 1$). In some embodiments, the semiconductor material having this composition may include GaN, AlN, AlGaN, InGaN, InN, InAlGaN, AlInN, and the like. The second semiconductor layer 127 may be formed by growing the semiconductor material so as to contain the n-type dopant, such as Si, Ge, Se, Te, O, C, and the like.

The anode 121 may be disposed on a lower surface of the first semiconductor layer 123 to contact the first semiconductor layer 123. In one embodiment, the anode 121 may be used as the substrate 110 providing a stack structure. The cathode 129 may be disposed on an upper surface of the second semiconductor layer 127 to contact the second semiconductor layer 127.

In one embodiment, the anode 121 and the cathode 129 may be formed of various metals, for example, Al, Ti, Cr, Ni, Au, Ag, Ti, Sn, Ni, Cr, W, and Cu, or alloys thereof. The anode 121 and the cathode 129 may be formed in a single layer or multiple layers.

In one embodiment, the light emitting diode 120 may emit light in various wavelength bands depending upon the material and stack structure thereof. The light emitted from the light emitting diode 120 is ultraviolet (UV) light, visible light, or infrared (IR) light, without being limited thereto. The light emitting diodes 120 may emit light having various wavelengths depending upon the material and composition of the light emitting layer. In this embodiment, the light emitting diode 120 may emit light in the UV wavelength band.

Although the light emitting diode 120 according to this embodiment is a vertical type, it should be understood that the light emitting diode 120 is not limited thereto and may be implemented with other types without departing from the concept of the present disclosure.

Referring again to FIG. 1 to FIG. 4, the luminous region and the non-luminous region adjacent to the luminous region are provided with the pad portion to supply power to the light emitting diode 120.

The pad portion includes first pads 111 connected to the anodes 121 of the light emitting diodes 120 and second pads 130 (shown in FIG. 4) connected to the cathodes 129 of the light emitting diodes 120.

The first pads 111 may be disposed in the luminous region and correspond to the light emitting diodes 120, respectively, and may be placed at the same locations of the light emitting diodes 120. That is, the number of first pads 111 may be the same as the number of light emitting diodes 120 mounted on the substrate 110.

Each of the first pads 111 is provided as a site for mounting the light emitting diode 120 and may have substantially the same shape as the light emitting diode 120 in plan view. In the embodiment, the first pad 111 may be integrally formed with the substrate 110. In this embodiment, nine light emitting diodes 120 may be disposed in the form of a 3×3 matrix and nine first pads 111 may also be provided corresponding to the light emitting diodes 120. The plurality of first pads 111 may be regularly arranged in rows and columns corresponding to arrangement of the light emitting diodes 120. However, it should be understood that the number of light emitting diodes 120 is not limited thereto.

The light emitting diode 120 is mounted on the first pad 111. A conductive bonding member may be provided to each of the first pad 111 and the anode of the light emitting diode 120. As the conductive bonding member, conductive pastes formed of a conductive material, for example, silver (Ag) pastes, may be used. Accordingly, the first pad 111 and the anode 121 of the light emitting diode 120 are electrically connected to each other therethrough.

The second pad 130 may be disposed in the luminous region and along a region adjacent to the luminous region, specifically along the circumference of the luminous region, as shown in FIG. 4. The second pad 130 is disposed at a location separated from the light emitting diode 120.

The second pad 130 may be disposed outside the plurality of first pads 111. The second pad 130 may be provided in plural. For example, four second pads 130 are disposed outside the plurality of first pads 111 to surround the first pads 111.

The second pads 130 may be connected to the cathodes 129 of the light emitting diodes 120 by wire bonding. In other words, an upper surface of each of the second pads 130 is connected to the cathode of the light emitting diode 120 through a wire W, as shown in FIG. 4. Here, although the second pads 130 are connected to the cathodes of the light emitting diodes 120 through two wires W, it should be understood that this structure is provided for convenience of description and a single wire or a different number of wires W may be used.

In embodiments of the present disclosure, the number of light emitting diodes 120 and the number of first and second pads 111, 130 are not limited thereto and may be determined in various ways.

The non-luminous region is provided with the terminal unit electrically connected to the pad portion. The terminal unit is disposed in a region on the substrate 110 in which the reflector 180 and the window 190 are not disposed.

The terminal unit is provided to one side of the substrate 110 to facilitate connection to an external power source and includes a first terminal 141 and a second terminal 143, as shown in FIG. 3. However, it should be understood that the location of the terminal unit is not limited thereto and may be changed.

The first terminal 141 is electrically connected to the first pad 111. In the embodiment, the first terminal 141 may be integrally formed with the substrate 110. When the substrate 110 is formed of a metal, the first pad 111 is electrically connected to the first terminal 141. The second terminal 143 may be placed near the first terminal 141 and may be electrically connected to the second pad 130. The second terminal 143 may be electrically connected to the second pad 130 through a conductive wire on the substrate 110, as in a wire formed on a printed circuit board.

Each of the first terminal 141 and the second terminal 143 may be provided with a separate compression terminal so as to be electrically connected to an external power source connector.

In this embodiment, the first terminal 141 and the second terminal 143 are formed of a conductive material. For example, the first and second terminals 141, 143 may be formed of a metal. The metal may include copper, iron, nickel, chromium, aluminum, silver, gold, titanium, palladium, and alloys thereof. In addition, each of the first and second terminals 141, 143 may be a single layer film or a multilayer film. For example, the first and second terminals 141 and 143 may be formed of Ni/Au, Ni/Ag and Ni/Pd/Au.

The antistatic element 160 may be further provided to the terminal unit. The antistatic element 160 may be electrically connected to the first and second terminals 141, 143 and may be realized by a Zener diode or a transient voltage suppressor (TVS). The antistatic element 160 prevents damage to the light emitting apparatus due to discharge or surge of static electricity.

In addition to the antistatic element 160, the temperature measurement device 170 may be further disposed on the substrate 110. The temperature measurement device 170 may serve to measure the temperature of the light emitting apparatus due to operation of the light emitting diodes 120. According to one embodiment, the temperature measurement device 170 may measure resistance to determine the temperature of the light emitting apparatus.

In addition, a terminal may be formed on the substrate 110 to be connected to an element connector DC for supplying power to the antistatic element 160 and/or the temperature measurement device 170, as shown in FIG. 3.

Next, the light emitting apparatus according to the embodiment of the present disclosure will be described in detail with reference to FIGS. 1-4.

The light emitting apparatus includes the substrate 110, the first pads 111, the second pads 130, the light emitting diodes 120, the reflector 180, and the window 190, which are mounted on the substrate 110.

The substrate 110 may have a plate shape and a substantially flat upper surface. Here, in the luminous region on which the light emitting diodes 120 are mounted, the first pads 111 may be integrally formed with the substrate 110. For example, the first pads 111 may be realized by protrusions protruding from the upper surface of the substrate 110. When the substrate 110 is used as the first pads 111, an external power source may be electrically connected to the substrate 110 in order to supply electric power to the first pads 111. In addition, with the structure where the first pads 111 are integrally formed with the substrate 110, heat generated from the light emitting diodes 120 mounted on the first pads 111 can be directly transferred to the substrate 110 through the first pads 111, thereby enabling rapid dissipation of heat. Further, although not shown in the drawings, the first terminal 141, the first terminal 141 (161) for the antistatic element 160, and the temperature measurement device 170 may also be realized by protrusions protruding from the upper surface of the substrate 110 in the luminous region thereof.

A first insulating layer 103 is formed on the substrate 110. The first insulating layer 103 serves to insulate the first pads 111 from the second pads 130. The first insulating layer 103 covers at least part of the upper surface of the substrate 110. In this embodiment, as shown in FIG. 4, the first insulating layer 103 is formed in most regions of the substrate 110 excluding regions of the substrate 110 in which the protrusions are formed.

In some forms, the first insulating layer 103 may be formed of various insulating materials having adhesive strength, for example, a polymer resin. The material of the first insulating layer 103 is not particularly limited.

The second pads 130 are disposed on the first insulating layer 103 and are disposed adjacent to the first pads 111 so as to be spaced apart therefrom. As shown in the drawings, the second pads 130 may be disposed on opposite sides of the luminous region, respectively, and may be electrically connected to the light emitting diodes 120 by wires W. Here, the second pads 130 may have the same height as the first pads 111. The second pads 130 are electrically insulated from the first pads 111 by the first insulating layer 103.

In this embodiment, the first pads 111 and the second pads 130 are formed of a conductive material. For example, the first pads 111 and the second pads 130 may be formed of a metal, which may include copper, iron, nickel, chromium, aluminum, silver, gold, titanium, palladium, and alloys thereof. In one embodiment, one of the first pad 111 and the second pad 130, particularly, the second pad 130, may be a single layer pad or a multilayer pad. For example, the first pads 111 and the second pads 130 may be formed of Ni/Au, Ni/Ag and Ni/Pd/Au.

A second insulating layer 105 may be formed in a region of the substrate 110, on which the second pad 130 is disposed.

The second insulating layer 105 may be formed of various insulating materials, for example, a photosensitive resist (PSR). However, it should be understood that the material of the second insulating layer 105 is not limited thereto.

The second insulating layer 105 covers most of the upper surface of the substrate 110 except for some regions of the first pads 111 and the second pads 130 adjacent to the luminous region. The light emitting diodes 120 are disposed on the first pads 111 to which the second insulating layer 105 is not provided, and the wire W is connected to the second pads 130 to which the second insulating layer 105 is not provided.

The second insulating layer 105 is not formed on at least part of the first and second terminals 141, 143 and the substrate holes. In addition, the second insulating layer 105 is not formed on the first and second terminals 141, 143 for the antistatic element 160, on which the antistatic element 160 is mounted, and is not formed on the terminal for the temperature measurement device 170. Upper surfaces of the protrusions of the substrate 110 or upper surfaces of the second pads 130 may be exposed on a portion of the substrate 110 to which the second insulating layer 105 is not provided, as shown in FIG. 4.

The reflector 180 is disposed on the second insulating layer 105. The reflector 180 is disposed on the substrate 110 and may be bonded to the substrate 110 by the bonding layer 107. The bonding layer 107 is disposed between the reflector 180 and the substrate 110 and may be applied to regions of the substrate 110 excluding the substrate holes.

As such, the reflector 180 may be coupled to the substrate 110 by the bonding layer 107 and may be coupled again thereto by fastening members, as shown in FIGS. 1-4. Here, when the reflector 180 is normally placed on the substrate 110, the fastening hole 151 of the reflector 180 extends to the corresponding substrate hole of the substrate 110 to form a single hole and a fastening member, such as a screw 153, recouples the reflector 180 to the substrate 110 through the fastening hole 151 and the substrate hole. As such, by recoupling the reflector 180 to the substrate 110 using the fastening member, it is possible to prevent the reflector 180 from being separated from the substrate 110 even when adhesive strength of the bonding layer 107 is reduced due to heat generated from the light emitting diodes 120. Here, the bonding layer 107 may contain a material capable of transferring heat from the substrate 110 to the reflector 180.

The window 190 is disposed on the stepped portion 181 of the reflector 180 and may also be disposed on the bonding layer, although not shown in the drawings. The window 190 is disposed above the light emitting diodes 120 and overlaps the light emitting diodes 120 in plan view. The window 190 may have various shapes and may change the traveling path of light emitted from the light emitting diodes 120. In one embodiment, the window 190 may narrow the beam angle of light emitted from the light emitting diodes 120 to a predetermined angle or less.

Figure 6A:
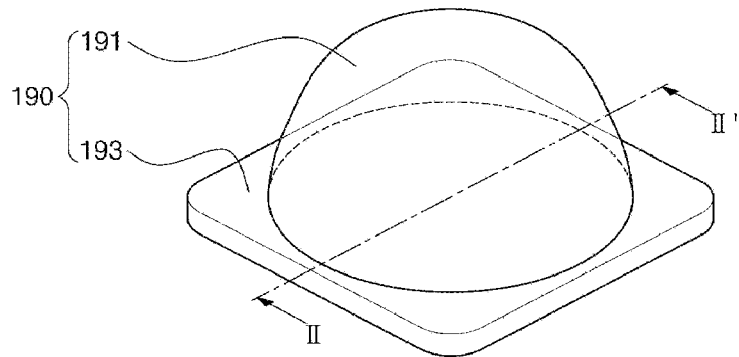
FIG. 6A is a perspective view of a window in the light emitting apparatus according to the embodiment of the present disclosure.
Figure 6B:
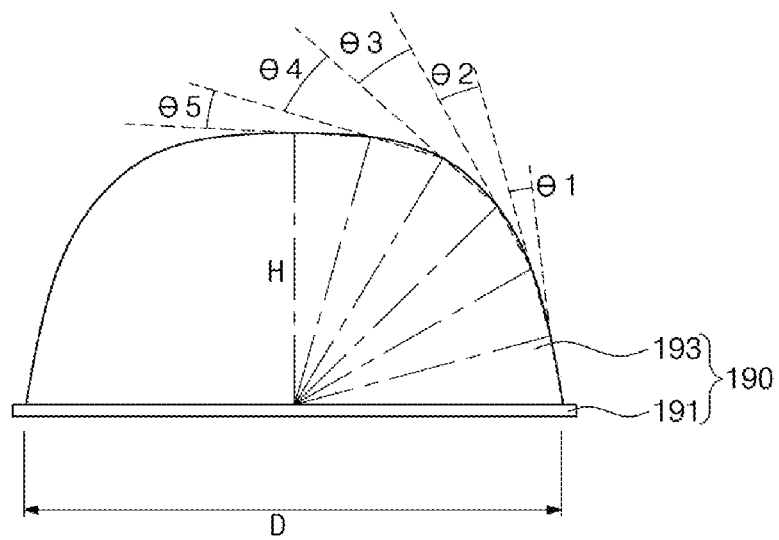
FIG. 6B is a cross-sectional view of the window taken along line II-II' of FIG. 6A.
Figure 6C:
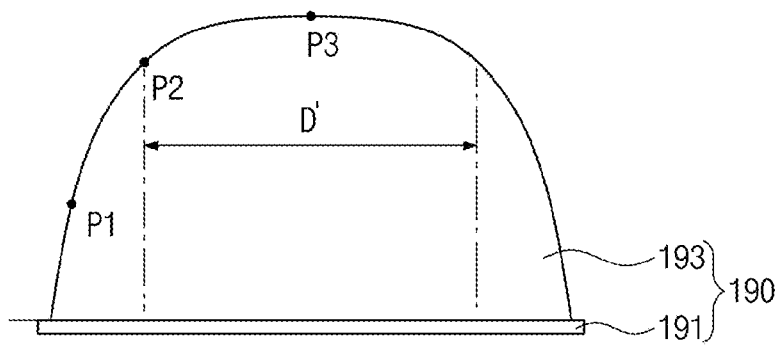
FIG. 6C is a cross-sectional view of the window taken along line II-II' of FIG. 6A.

FIG. 6A is a perspective view of the window in the light emitting apparatus according to the embodiment of the present disclosure, and FIG. 6B and FIG. 6C are cross-sectional views of the window taken along line II-II' of FIG. 6A.

Referring to FIG. 6A to FIG. 6C, a window 190 according to one embodiment of the present disclosure includes a base 191 having a plate shape and a lens portion 193 protruding from one surface of the base 191.

The base 191 may include a plate having a shape corresponding to the opening of the reflector 180 (see FIG. 1 through FIG. 4), for example, a rectangular shape. The base 191 has a size corresponding to the size of the opening so as to be seated on the stepped portion in the opening of the reflector 180. However, it should be understood that the shape or size of the base 191 is not limited thereto and may be changed according to the shape of the opening and/or the stepped portion.

The lens portion 193 is formed on one surface of the base 191 and protrudes from the one surface of the base 191. Here, the lens portion 193 may be convex in a light traveling direction. The lens portion 193 serves to condense light emitted from light emitting diodes 120 and has a convex lens shape.

In one embodiment, the base 191 may be integrally formed with the lens portion 193, but is not limited thereto. Alternatively, the base 191 and the lens portion 193 may be separately formed and coupled to each other.

The lens portion 193 may include a bottom contacting the base 191 and a curved portion 193 corresponding to a portion protruding from the base 191, and has a substantially hemispherical shape. The lens portion 193 may have a circular shape in plan view. That is, the bottom of the lens portion has a circular shape. However, it should be understood that the bottom of the lens portion is not limited thereto and may have an elliptical shape or other shapes.

In this embodiment, although the lens portion 193 has a substantially hemispherical shape, the lens portion 193 does not have an accurate hemispherical shape and has a smaller height than the hemispherical shape. In other words, a cross-section of the lens portion 193 taken along the center of the circular shape is not a semi-circular cross-section. The lens portion 193 has a smaller height than a diameter D of a circle constituting the bottom of the base. In particular, the height of the lens portion 193 may be 70% or less of the diameter D of the bottom.

Here, the height H of the lens portion 193 means the shortest distance from the bottom to the vertex of the lens portion 193, that is, a distance from the bottom to the vertex of the lens portion 193 in a direction perpendicular to the base 191. When the bottom has a circular shape, the height H of the lens portion 193 refers to a distance from an upper surface of the base 191 to a point the lens portion 193 corresponding to the center of a circular shape thereof.

In one embodiment, in a cross-section of the lens portion 193 perpendicular to the upper surface of the base 191 and taken along the center of the circular shape on the base 191, the lens portion 193 may have different gradient variations depending upon an angle from the upper surface of the base with reference to the center of the circular shape. In particular, the lens portion 193 is configured to have a gradient variation that gradually increases and then decreases.

Accordingly, in the window 190 according to the embodiment, when the lens portion 193 is divided into a plurality of regions according to an angle from the upper surface of the base 191 with reference to the center of the circular shape, a gradient variation in each region is different from that of another region adjacent thereto. For example, assuming that the lens portion 193 sequentially has first to $m^{th}$ regions (m being an integer of 3 or more) according to the angle from the upper surface of the base with reference to the center of the circular shape, a gradient variation in an $n^{th}$ region (1<n<m) may be greater than a gradient variation in an $(n-1)^{th}$ region and a gradient variation in an $(n+1)^{th}$ region.

In FIG. 6B, for convenience of description, the lens portion 193 is divided into 6 sectors according to an angle from the upper surface of the base 191 with reference to the center of the circular shape and angles changed between lines connecting both sides of an arc of each sector are denoted by θ1, θ2, θ3, θ4, and θ5, respectively. Referring to FIG. 6B, the variations in angle, that is, the gradient variations, may have different values in regions adjacent to one another and may have a shape that gradually increases and then decreases again. In particular, the gradient variations are gradually changed such that the variation of the angle in the fifth region is the largest and the variation of the angle in the sixth region tends to decrease again.

In addition, the curved portion has different radii of curvature depending on the location thereof. For example, in a cross-section of the lens portion 193 taken across the center of the lens portion 193, the curved portion may have different radii of curvature depending on the height of the lens portion 193 from the bottom thereof.

According to one embodiment, in the cross-section taken across the center of the lens portion 193, the radius of curvature of a curve constituting the lens portion 193 does not monotonously increase or decrease from the upper surface of the base 191 to the vertex of the lens portion 193. According to the embodiment, in the cross-section taken across the center of the lens portion 193, the radius of curvature of the curve constituting the lens portion 193 may gradually increase and then decrease from the upper surface of the base 191 to the vertex of the lens portion 193. Accordingly, in the cross-section taken across the center of the lens portion 193, a portion having the smallest radius of curvature may be placed between the lowermost portion of the lens portion 193 and the uppermost portion of the lens portion 193 (that is, the vertex thereof).

By way of example, assuming that radii of curvature of three points P1, P2, P3 arranged in sequence on the cross-section taken across the center of the lens portion 193 is first to third radii of curvature, a point having the smallest radius of curvature may be placed between the first point and the third point. Assuming that the point having the smallest radius of curvature is the second point P2 on the cross-section taken across the center of the lens portion 193, the second radius of curvature is smaller than the first and third radii of curvature. Here, the light emitting diodes are disposed in a region on the surface of the substrate corresponding to a region between the points having the smallest radius of curvature at both sides (indicated by D' in the drawing) on the cross-section taken across the center of the lens portion 193, that is, between the second points P2 at both sides. In the lens portion 193, since the radius of curvature gradually increases from the second point P2 having the smallest radius of curvature to the third point P3, condensation of light emitted from the light emitting diodes and traveling upwards from the bottom is easily achieved.

In one embodiment, when the light emitting diode is provided in plural, all of the light emitting diodes may be disposed in the region D' between the points having the smallest radius of curvature at both sides on the cross-section taken across the center of the lens portion 193. Accordingly, the light emitting diodes disposed in the outermost regions may also be disposed between the points D' having the smallest radius of curvature at both sides on the cross-section taken across the center of the lens portion 193.

For example, when the light emitting diodes are arranged in a p×q matrix, all of the light emitting diodes including light emitting diodes located in the outermost regions of the p×q matrix (that is, 1 row 1 column, p row 1 column, 1 row q column, p row p column) may be disposed between the points D' having the smallest radius of curvature at both sides on the cross-section taken across the center of the lens portion 193.

When the light emitting diode is provided in plural, the quantity of light is different between the top of each of the light emitting diodes 120 and a gap between adjacent light emitting diodes 120. As a result, depending on arrangement of the light emitting diodes 120, portions having larger and smaller quantities of light intensity than adjacent portions may appear alternately, whereby peaks and valleys may appear clearly in a light profile. In this case, it is difficult to achieve uniform irradiation with light due to difference in quantity of light depending on the location. However, when light is condensed through the window 190, the valley is significantly reduced in the light profile and the difference in quantity of light according to the location within a beam angle of 90 degrees is significantly reduced. Accordingly, uniform light may be implemented as a whole without a sudden change in quantity of light.

In the following description, light profiles of light emitting apparatuses including a conventional window and the window having the above structure will be compared.

Figure 7A:
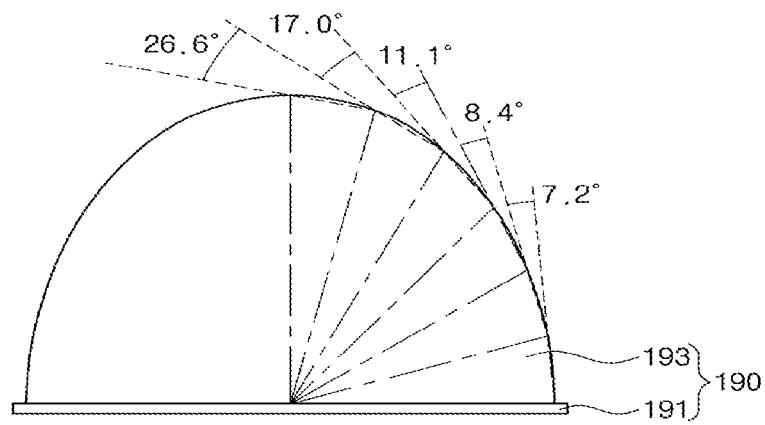
FIG. 7A is a view of a conventional window of a conventional light emitting apparatus.
Figure 7B:
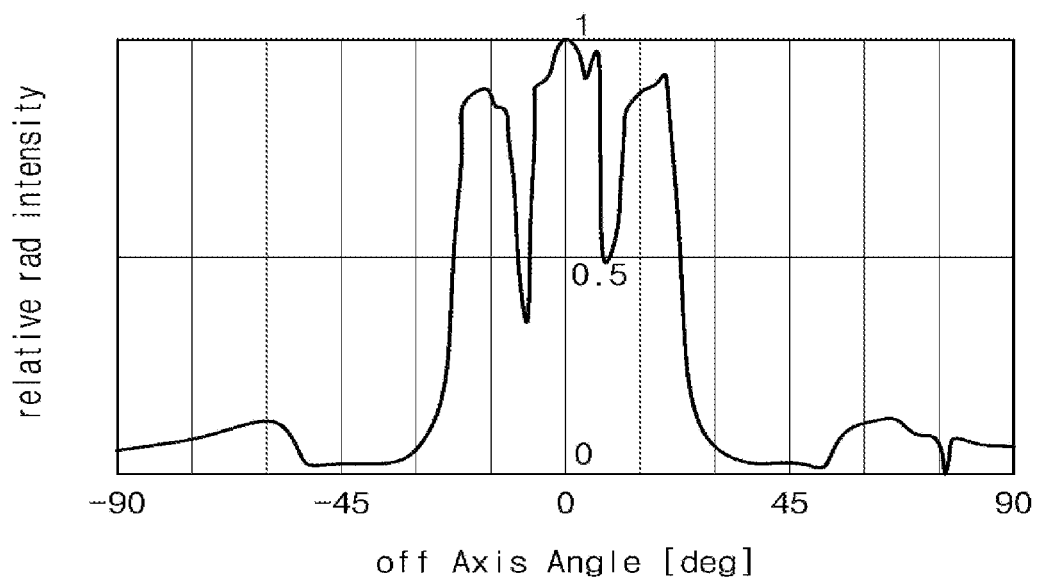
FIG. 7B is a view of a light profile of a conventional light emitting apparatus.
Figure 8A:
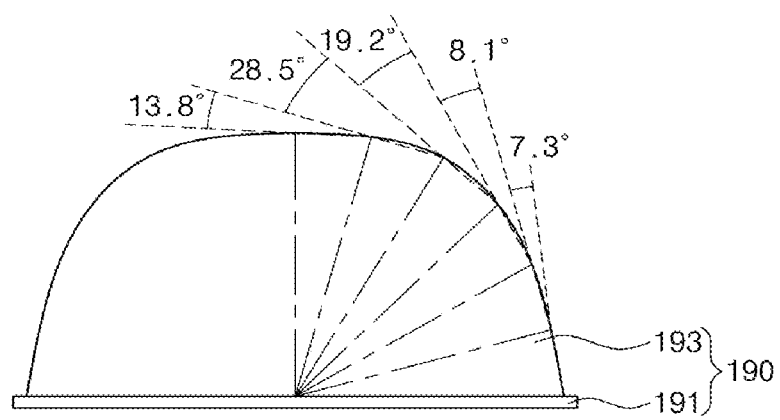
FIG. 8A is a view of a window according to one embodiment of the present disclosure
Figure 8B:
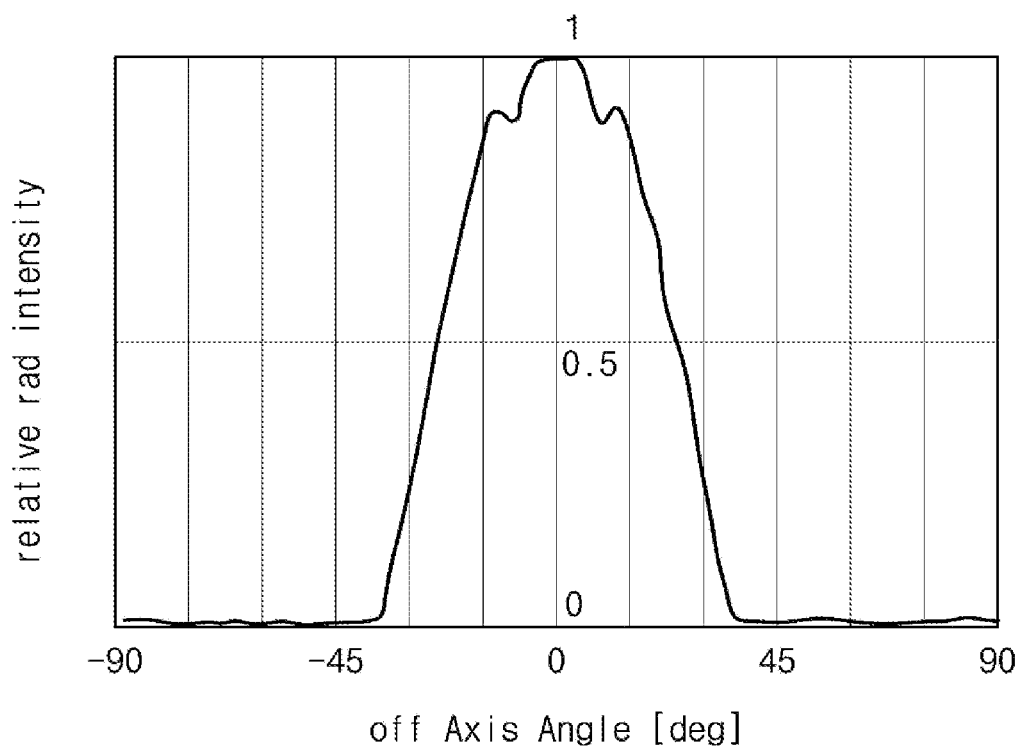
FIG. 8B is a light profile of a light emitting apparatus including the window of FIG. 8A.

FIG. 7A and FIG. 7B are a view of a conventional window and a light profile of a conventional light emitting apparatus including the same, and FIG. 8A and FIG. 8B are a view of a window according to one embodiment of the present disclosure and a light profile of a light emitting apparatus including the same, respectively. Here, the conventional light emitting apparatus and the light emitting apparatus according to the embodiment are manufactured under the same conditions except for the window. Nine (9) light emitting diodes were arranged in a 3×3 matrix and a distance between adjacent light emitting diodes was 200 micrometers. The window shown in FIG. 7A and FIG. 7B had a diameter-to-height ratio of 76% and the window shown in FIG. 8A and FIG. 8B had a diameter-to-height ratio of 55%.

First, referring to FIG. 7A and FIG. 7B, when the lens portion is divided into 6 sectors according to an angle from the upper surface of the base with reference to the center of the circular shape and gradient variations between lines connecting both sides of an arc of each sector are denoted by first to fifth variations, respectively, the first to fifth variations have different values in adjacent regions and gradually increase.

In a light profile of the light emitting apparatus employing such a window, although the beam angle is within 90 degrees, there is a large difference in quantity of light according to the angle. As a result, the peaks and the valleys are clearly shown in the light profile and, although there are differences depending on the angle, there is a section in which the quantity of light corresponding to the valley is only about 50% of the quantity of light at the peak. These peaks and valleys are caused by the distance between adjacent light emitting diodes and, in this case, it is difficult to achieve uniform irradiation with light due to difference in quantity of light depending on the location, as shown in FIG. 7B.

Next, referring to FIG. 8A and FIG. 8B, when the lens portion is divided into 6 sectors according to an angle from the upper surface of the base with reference to the center of the circular shape and gradient variations between lines connecting both sides of an arc of each sector are denoted by first to fifth variations, respectively, the first to fifth variations have different values in adjacent regions and have a shape in which the variations gradually increase and then decrease.

In a light profile of the light emitting apparatus employing such a window, the beam angle is within 90 degrees and the quantity of light according to the angle also shows a constant tendency and a uniform value as a whole. That is, in the light profile, there is only a large peak as a whole and a valley is not clearly shown. Even when there is a peak, the difference between the valley and the peak is less than 10%, as shown in FIG. 8B.

As a result, it can be seen that, even with the same light emitting diodes as the light emitting apparatus shown in FIG. 7A and FIG. 7B, the light emitting apparatus shown in FIG. 8A and FIG. 8B exhibits improvement in uniformity and concentration of light and uniform irradiation with light is facilitated due to difference in quantity of light depending on the location.

Figure 9A:
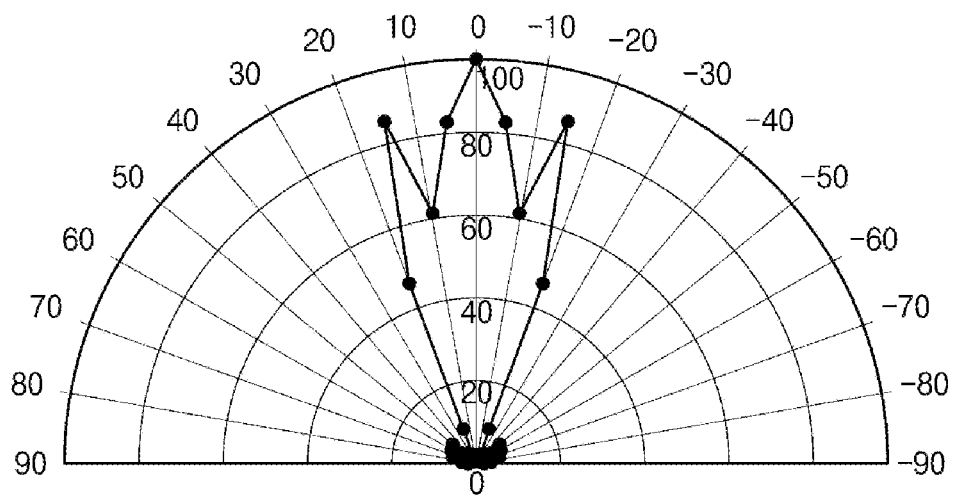
FIG. 9A is a simulation profile of light emitted from a conventional light emitting apparatus including a window.
Figure 9B:
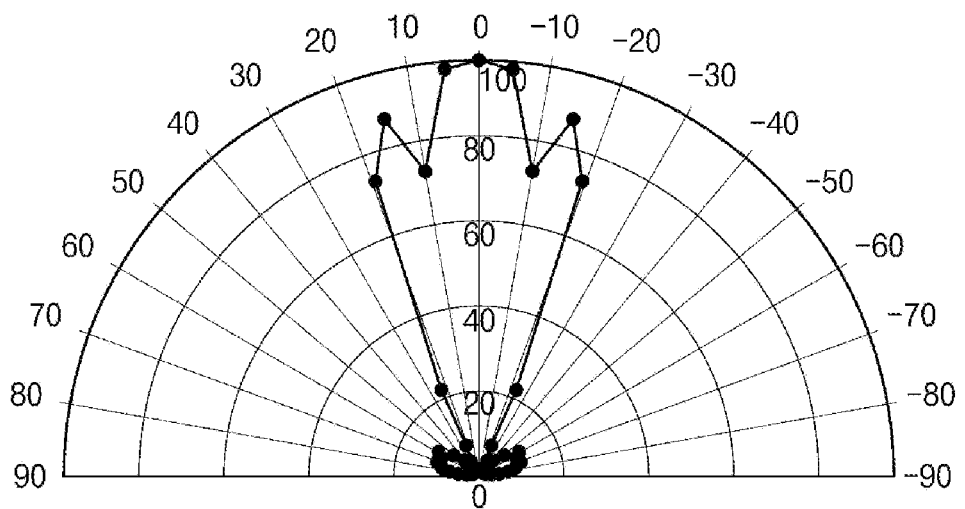
FIG. 9B is a simulation profile of light emitted from another conventional light emitting apparatus.
Figure 9C:
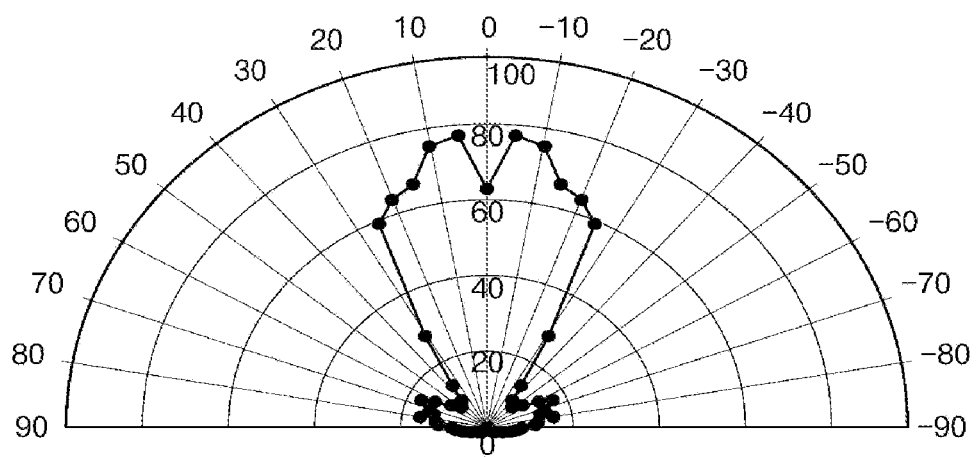
FIG. 9C is a simulation profile of light emitted from further another conventional light emitting apparatus.
Figure 10A:
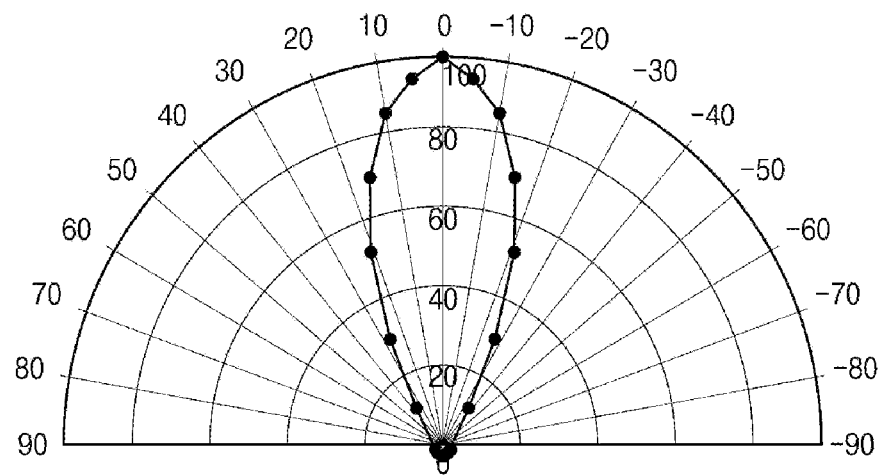
FIG. 10A is a simulation profiles of light emitted from a light emitting apparatus including a window according to one embodiment of the present disclosure.
Figure 10B:
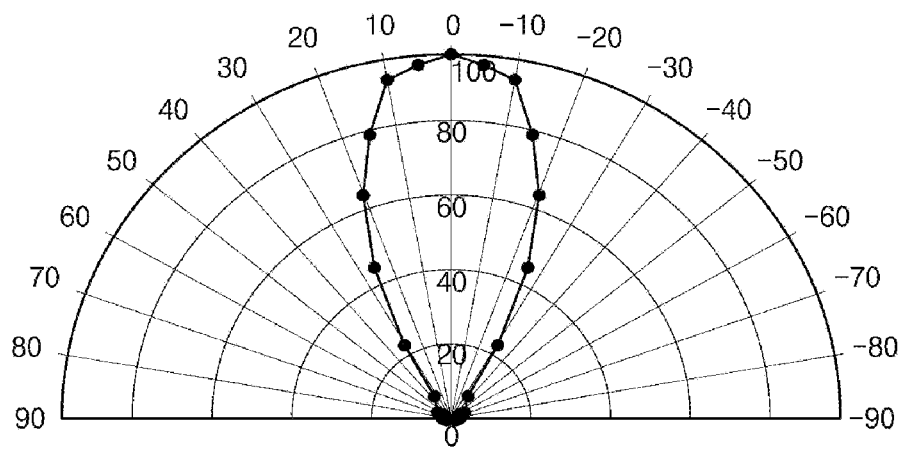
FIG. 10B is a simulation profile of light emitted from another light emitting apparatus.
Figure 10C:
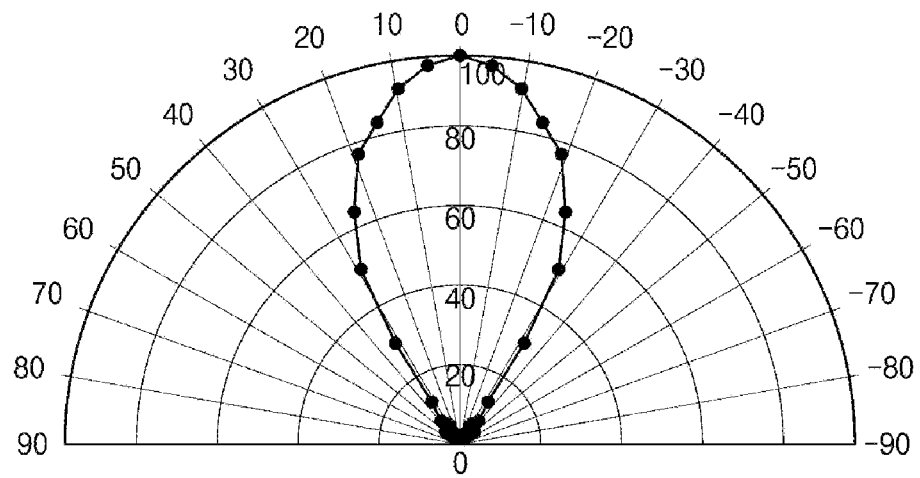
FIG. 10C is a simulation profile of light emitted from further another light emitting apparatus.

FIG. 9A to FIG. 9C are simulation profiles of light emitted from a conventional light emitting apparatus including a window and FIG. 10A to FIG. 10C are simulation profiles of light emitted from a light emitting apparatus including a window according to one embodiment of the present disclosure. Here, the conventional light emitting apparatus and the light emitting apparatus according to the embodiment are manufactured under the same conditions except for the window. The conventional light emitting apparatus employed the window shown in FIG. 7A and the light emitting apparatus according to the embodiment employed the window shown in FIG. 8A.

In FIG. 9A and FIG. 10A, nine (9) light emitting diodes were arranged in a 3×3 matrix and a distance between adjacent light emitting diodes was 200 micrometers. In FIG. 9B and FIG. 10B, nine (9) light emitting diodes were arranged in a 3×3 matrix and had a larger area than the light emitting diodes shown in FIG. 9A and FIG. 10A. Here, a distance between adjacent light emitting diodes was 200 micrometers. In FIG. 9C and FIG. 10C, sixteen (16) light emitting diodes were arranged in a 4×4 matrix and had a larger area than the light emitting diodes shown in FIG. 9A and FIG. 10A. Here, a distance between adjacent light emitting diodes was 200 micrometers.

Referring to FIG. 9A to FIG. 9C, although the beam angle is within 90 degrees, there is a large difference in quantity of light according to the angle. As a result, the peaks and the valleys are clearly shown in the light profile. It is difficult to achieve uniform irradiation with light due to difference in quantity of light depending on the location.

Referring to FIG. 10A through FIG. 10C, the beam angle is within 90 degrees and the quantity of light according to the angle also shows a constant tendency and a uniform value as a whole. That is, in the light profile, there is only a large peak as a whole and a valley is not clearly shown.

As such, it can be seen that the light emitting apparatus according to the teachings of the present disclosure achieves improvement in uniformity and concentration of light.

Figure 11A:
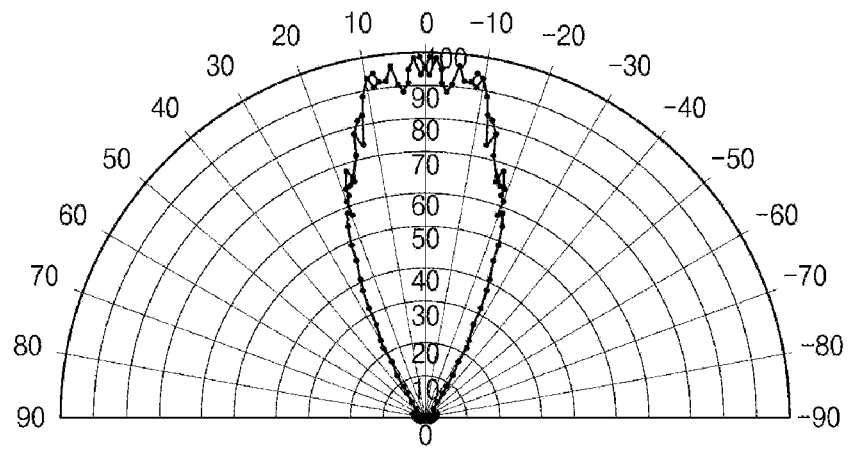
FIG. 11A is a light profile of light emitting apparatus including a window having a similar shape to the window shown in FIG. 8A and a different height from the window shown in FIG. 8A.
Figure 11B:
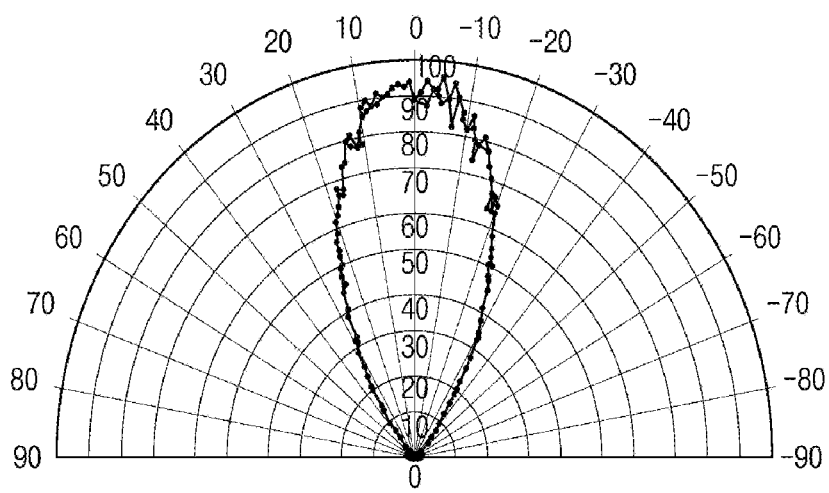
FIG. 11B is a light profile of light emitting apparatus including a window having a different height from the window shown in FIG. 11A.
Figure 11C:
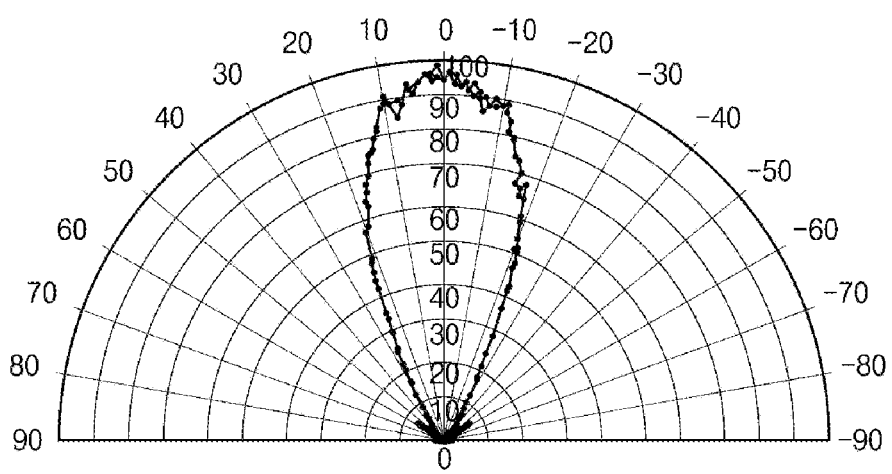
FIG. 11C is a light profile of light emitting apparatus including a window having a different height from the window shown in FIG. 11B.

FIG. 11A to FIG. 11C are light profiles of light emitting apparatuses each including a window according to the teachings of the present disclosure, in which the window has a similar shape to the window shown in FIG. 8A and a different height from the window shown in FIG. 8A. Here, the light emitting apparatuses according to the embodiments were manufactured under the same conditions as ones of FIG. 8A except for the window. FIG. 11A shows a window includes a base having a diameter of 10 mm and a height of 4.5 mm, FIG. 11B shows a window includes a base having a diameter of 10 mm and a height of 5.5 mm, and FIG. 11C shows a window includes a base having a diameter of 10 mm and a height of 6.5 mm.

Referring to FIG. 11A to FIG. 11C, for all of the light emitting apparatuses, the beam angle is within 90 degrees and the quantity of light according to the angle also shows a constant tendency and a uniform value as a whole. That is, in the light profile, there is only a large peak as a whole and a valley is not clearly shown. Here, it can be seen that even an unclear portion that is determined to be a valley had little difference in intensity from all peaks.

As described above, in the light profile, the valley is significantly reduced and the difference in quantity of light according to the location within a beam angle of 90 degrees is also significantly reduced. Accordingly, it is possible to realize uniform light without rapid variation in intensity of light. As a result, the light emitting apparatus according to the embodiment of the present disclosure can provide light having high directionality while minimizing deviation in intensity of light in a predetermined region.

Figure 12:
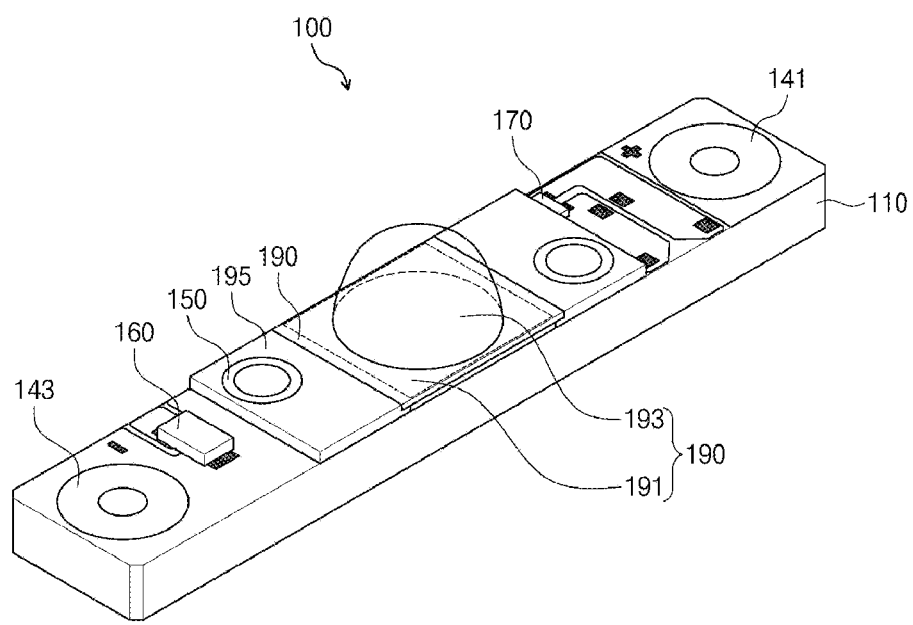
FIG. 12 is a perspective view of a light emitting apparatus according to one embodiment of the present disclosure.

The light emitting apparatus according to one or more embodiments of the present disclosure may be realized in various sizes and shapes and may be provided singularly or in plural to other devices. FIG. 12 is a perspective view of a light emitting apparatus according to one embodiment of the present disclosure. The following description will focus on different features of the embodiment from the above embodiments in order to avoid repetition of description and components having substantially the same functions are denoted by the same or like reference numerals.

Referring to FIG. 12, the light emitting apparatus according to the embodiment has a generally similar shape to the light emitting apparatus shown in FIG. 1 except for a substrate 110, reflectors, and the like. The substrate 110 may have a rectangular shape having long sides and short sides and the reflectors may be disposed at opposite sides of the light emitting diode to be spaced apart from each other. A first terminal 141 and a second terminal 143 are provided to opposite ends of the substrate 110 at which the reflector is not formed.

As such, the light emitting apparatuses having various shapes may be arranged in various ways to achieve efficient illumination of a target with light.

The light emitting apparatus according to the embodiments may be employed in various devices. For example, the light emitting apparatus according to the embodiments may be used for a light radiator. The light radiator emits light to various materials for various purposes. In one embodiment, the light radiator may be used to cure polymeric materials. The light radiator may include at least one light emitting apparatus described above.

Although some embodiments have been described herein, it should be understood by those skilled in the art that these embodiments are given by way of example only, and that various modifications, variations, and alterations can be made without departing from the spirit and scope of the present disclosure.

Therefore, it should be understood that the scope of the present disclosure should be defined by the appended claims and equivalents thereto.

What is claimed is:

1. A light emitting device comprising:
   a substrate having a luminous region and a non-luminous region;
   a plurality of light emitting structures disposed on the luminous region of the substrate and configured to emit light with a first range of a beam angle, each light emitting structure having an anode and a cathode;
   a window having a dome shape and disposed to cover the luminous region, the window configured to control a traveling path of light emitted from the plurality of light emitting structures by condensing the light emitted from the plurality of light emitting structures to have a second range of the beam angle that is not greater than the first range of the beam angle;

a reflector configured to support the window and reflect the light emitted from the plurality of light emitting structures, wherein the reflector has an opening that exposes the plurality of light emitting structures mounted on the substrate; and an adhesive layer disposed between the window and the reflector;

first pads disposed in the luminous region to correspond to the plurality of light emitting structures, the first pads electrically coupled to anodes of the plurality of light emitting structures, respectively; and a second pad disposed along a circumference of the luminous region and separately from the plurality of light emitting structures, the second pad electrically coupled to cathodes of the plurality of light emitting structures, wherein a distance between two adjacent light emitting structures of the plurality of light emitting structures is 500 micrometers or less.

2. The light emitting device of claim 1, wherein the non-luminous region is provided with conductive patterns electrically connected to the plurality of light emitting structures.

3. The light emitting device of claim 1, wherein the first range of the beam angle is 90 degrees or more and the second range of the beam angle is 90 degrees or less.

4. The light emitting device of claim 1, wherein, in a light profile of light emitted from the light emitting device, a difference between a valley value and a peak value is 10% or less.

5. The light emitting device of claim 1, wherein the opening defines the luminous region.

6. The light emitting device of claim 1, wherein a height of the window is 70% or less of a lower diameter thereof.

7. The light emitting device of claim 1, wherein the distance between the two adjacent light emitting structures of the plurality of light emitting structures is 200 micrometers.

8. The light emitting device of claim 1, wherein each of the first pad is disposed between the substrate and each of the light emitting structures; and the plurality of light emitting structures are connected to the second pad by electrical bonding.

9. The light emitting device of claim 1, wherein the light emitting structures emit UV light.

10. A light emitting device comprising:

a substrate having a first region and a second region;

a plurality of light emitting structures disposed on the first region of the substrate, each light emitting structure having an anode and a cathode;

a window having a dome shape and disposed to cover the first region, the window configured to control a traveling path of light emitted from the plurality of light emitting structures; and a reflector configured to support the window and reflect the light emitted from the plurality of light emitting structures, wherein the reflector has an opening that exposes the plurality of light emitting structures mounted on the substrate;

first pads disposed in the first region to correspond to the plurality of light emitting structures, the first pads electrically coupled to anodes of the plurality of light emitting structures, respectively; and a second pad disposed along a circumference of the first region and separately from the plurality of light emitting structures, the second pad electrically coupled to cathodes of the plurality of light emitting structures, wherein, in a profile of light emitted from the light emitting device, a difference between a valley value and a peak value is 10% or less.

11. The light emitting device of claim 10, wherein a distance between two adjacent light emitting structures is 500 micrometers or less.

12. The light emitting device of claim 10, wherein the second region is provided with conductive patterns electrically connected to the light emitting structures.

13. The light emitting device of claim 10, wherein the plurality of light emitting structures emit light, via the dome shape of the window, at a beam angle of 90 degrees of more.

14. The light emitting device of claim 10, wherein the opening defines the first region.

15. A light emitting device comprising:

a substrate having a luminous region and a non-luminous region;

a light emitting unit disposed on the luminous region of the substrate and including a plurality of light emitting structures configured to emit light, each light emitting structure having an anode and a cathode;

a window disposed to cover the luminous region, the window configured to control a traveling path of light emitted from the light emitting unit;

a reflector configured to support the window and reflect the light emitted from the light emitting unit, wherein the reflector has an opening that exposes the light emitting unit mounted on the substrate; and an adhesive layer disposed between the substrate and the reflector;

first pads disposed to correspond to the plurality of light emitting structures and electrically coupled to anodes of the plurality of light emitting structures, respectively; and a second pad disposed outside the first pads and the plurality of light emitting structures, the second pad electrically coupled to cathodes of the plurality of light emitting structures, wherein, in a light profile of light emitted from the light emitting device, a difference between a valley value and a peak value is 10% or less.

16. The light emitting device of claim 15, wherein the non-luminous region is provided with conductive patterns electrically connected to the light emitting unit.

17. The light emitting device of claim 15, further comprising a phosphor portion disposed in the window.

18. The light emitting device of claim 15, wherein the reflector has a stepped portion on a top surface thereof.

19. The light emitting device of claim 15, wherein an inner wall of the opening has an inclined portion.

* * * * *